(12) United States Patent
Stewart

(10) Patent No.: US 6,308,569 B1
(45) Date of Patent: Oct. 30, 2001

(54) MICRO-MECHANICAL INERTIAL SENSORS

(75) Inventor: Robert E. Stewart, Woodland Hills, CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/365,336

(22) Filed: Jul. 30, 1999

(51) Int. Cl.$^7$ .......................... G01P 15/125; G01C 19/00
(52) U.S. Cl. .................................. 73/514.32; 73/504.04; 361/280
(58) Field of Search .......................... 73/504.12, 504.14, 73/504.04, 514.02, 514.32, 514.18, 514.21, 514.23, 514.36; 361/280, 283.1, 283.3

(56) References Cited

U.S. PATENT DOCUMENTS

| | | | |
|---|---|---|---|
| 5,349,858 | * 9/1994 | Yagi et al. | 73/514.02 |
| 5,352,918 | * 10/1994 | Thomas et al. | 73/514.32 |
| 5,504,032 | * 4/1996 | Gessner et al. | 73/514.32 |
| 5,656,778 | * 8/1997 | Roszhart | 73/514.29 |
| 6,105,427 | * 8/2000 | Stewart et al. | 73/514.32 |

* cited by examiner

Primary Examiner—Helen Kwok
(74) Attorney, Agent, or Firm—Elliott N. KRamsky

(57) ABSTRACT

Micromechanical inertial sensors are formed of a plurality of substantially-planar semiconductor wafers interspersed with oxide layers. The sensitive element is located within an internal aperture of a wafer of the device and is separate therefrom. It is connected to an overlying oxide layer at pedestals that minimize contact area to thereby reduce stray capacitance. Portions of side edges of the various wafers are successively recessed to create topside-exposed wafer sections that permit the grounding of all exposed portions of the device as operational potentials are applied to internal electrodes and sensitive elements.

16 Claims, 3 Drawing Sheets

MICRO-MECHANICAL INERTIAL SENSORS

BACKGROUND

1. Field of the Invention

The present invention relates to micromechanical devices for use in making inertial measurements. More particularly, the invention pertains to devices whose structures offer improved shielding, reduced stray capacitance and enhanced manufacturability over prior art devices.

2. Description of the Prior Art

Precision micro-mechanical devices have wide application in the fields of inertial navigation and guidance with respect to both long-range, re-usable vehicles, such as aircraft, and relatively short-range, one-use vehicles, such as munitions. Such devices may be employed to measure acceleration directly and rotation rate indirectly through the Coriolis principle. According to that principle, a body traveling at a velocity $\overline{V}$ subject to rotation $\overline{\Omega}$ experiences an acceleration $\overline{A}_c$ defined as the cross product $\overline{A}_c = 2\overline{\Omega} \times \overline{V}$. By imposing a sinusoidal relative velocity of the form:

$$\overline{V} = \overline{V}_o \sin \omega t$$

The corresponding Coriolis acceleration then becomes:

$$\overline{A}_c = 2\overline{\Omega} \times \overline{V}_o \sin \omega t$$

The measurement of rotation rate is obtained by determining the resultant Coriolis force exerted upon a deflectible force sensitive member.

Micromechanical devices are well suited for operation in low cost systems due to the compactness, simplicity and batch processing capabilities that they offer. In general, they feature a responsive element hinged to a frame along an edge (accelerometer) or a paddle that is rotatable about an axis defined by aligned flexure beams that support it with respect to a counter-oscillating hub (rotation rate sensor element). Pending U.S. patent application Ser. No. 09/127,375 of inventor Stanley F. Wyse entitled "Micromachined Rotation Sensor with Modular Sensor Elements" discloses inertial sensors of the foregoing type.

Systems, known as multisensors, that employ micromachined accelerometers of the type that include a hinged pendulous mass to measure both linear acceleration and angular rate (via the Coriolis principle) are taught, for example, in United States patents (property of the assignee herein) U.S. Pat. No. 4,996,877, entitled "Three Axis Inertial Measurement Unit With Counterbalanced Mechanical Oscillator"; U.S. Pat. No. 5,007,279, entitled "Three Axis Inertial Measurement Unit With Counterbalanced, Low Inertia Mechanical Oscillator"; U.S. Pat. No. 5,065,627 entitled "Three Axis Inertial Measurement Unit With Counterbalanced, Low Inertia Mechanical Oscillator;" and pending U.S. patent application Ser. No. 08/904,923 of Stanley F. Wyse entitled "Counterbalanced Triaxial Multisensor with Resonant Accelerometers". U.S. Pat. No. 5,614,742 of Thomas Gessner, et al. entitled "Micromechanical Accelerometer With Plate-Like Semiconductor Wafers" presents an example of an all-silicon, precision micromechanical accelerometer that comprises an assembly of five anisotropiocally-etched silicon wafers (each formed by a conventional wet process) bonded to one another to form a hermetically-sealed assembly. By forming a structure entirely of silicon layers coated with thin oxide layers, thermal coefficient mismatches are substantially overcome. As a result, the device is capable of withstanding a wide range of temperature variations with repeatability and stability. Pending U.S. patent application Ser. No. 09/127,643 of Robert E. Stewart, et al., property of the assignee herein entitled "Micromechanical Semiconductor Accelerometer", teaches an improvement on the patented device that employs SOI ("silicon-on-insulator") technology reduce parts count and complexity of assembly and manufacture of such a device.

While micromachined silicon devices of both the hinged accelerometer and paddle-like rotation sensor type provide essential elements of various inertial sensor systems, their very compactness subjects them to numerous sources of degradation. These include the presence of stray capacitance, unsatisfactory environmental shielding and designs that require bottom wire bonding access.

Analysis has shown that noise in the output of systems incorporating the above-described types of devices is a positive function of the ratio of stray to motional pickoff capacitance. A large value of stray capacitance can cause the pickoff amplifer to oscillate. Another source of error common to micromachined sensor devices results from incomplete shielding from the environment. This can result, in devices formed of multiple wafer layers, from the fact that a structure internal to a wafer layer, such as a paddle or pendulous mass, must be held at a non-ground potential. In such device, this prevents the grounding of exposed edge portions making them subject to undesired fluctuations of capacitance between the device and its housing or other apparatus upon repositioning, encountering surface deformations and the like. Such fluctuation negatively affects device performance and accuracy.

Among the problems inherent in the very small structures and working areas provided by micromachined devices are those arising from the need to maintain a hermetic seal of the cavity wherein the sensitive or responsive element resides while, at the same time, providing the shielding to avoid fluctuations and thereby enhance stability.

It is also highly desirable to provide devices that do not require bottom access to ohmic contacts, as this prevents the use of automatic bonding equipment as well as posing other difficulties. Such devices must typically be joined to a substrate. Conventional hybrid assemblies are not designed for bottom accessing.

SUMMARY OF THE INVENTION

The preceding and other shortcomings of the prior art are addressed by the present invention which provides, in a first aspect, a micromechanical silicon accelerometer. Such accelerometer includes top cover, top electrode, pendulum, bottom electrode, and bottom cover wafers. Each of such wafers is generally-planar.

The wafers are arranged so that the top cover wafer is adjacent the top electrode wafer, the top electrode wafer is adjacent the pendulum wafer, the pendulum wafer is adjacent the bottom electrode wafer, and the bottom electrode wafer is adjacent the bottom cover wafer. A first generally-planar oxide layer is located between the top cover and the top electrode wafers. A second generally-planar oxide layer is located between the top electrode and the pendulum wafer. A third generally-planar oxide layer is located between the pendulum and the bottom electrode wafers and a fourth generally-planar oxide layer is similarly located between the bottom electrode and the bottom cover wafers.

The pendulum wafer defines a substantially-planar pendulum member and a surrounding frame member having an internal aperture, the pendulum member being located within the internal aperture and separate from the frame member.

In a second aspect, the invention provides a micromechanical sensor element for an angular rate of rotation sensor. Such sensor element includes top cover, top electrode, sensing element, bottom electrode, and bottom cover wafers. Each of the wafers is generally-planar.

The wafers are arranged so that the top cover wafer is adjacent the top electrode wafer, the top electrode wafer is adjacent the sensing element wafer, the sensing element wafer is adjacent the bottom electrode wafer, and the bottom electrode wafer is adjacent the bottom cover wafer. A first generally-planar oxide layer is located between the top cover and the top electrode wafers. A second generally-planar oxide layer is located between the top electrode and the sensing element wafers. A third generally-planar oxide layer is located between the sensing element and the bottom electrode wafers and a fourth generally-planar oxide layer is similarly located between the bottom electrode and the bottom cover wafers.

The sensing element wafer defines a substantially-planar sensing member and a surrounding guard ring having an internal aperture, the sensing member being located within the internal aperture and separate from the frame.

The foregoing and other features and advantages of this invention will become further apparent from the detailed description that follows. This description is accompanied by a set of drawing figures. Numerals of the drawing figures, corresponding to those of the written description, point to the various features of the invention. Like numerals refer to like features throughout both the written description and the drawing figures.

DETAILED DESCRIPTION OF THE PREFERRED EMBODIMENT

Figure 1A:
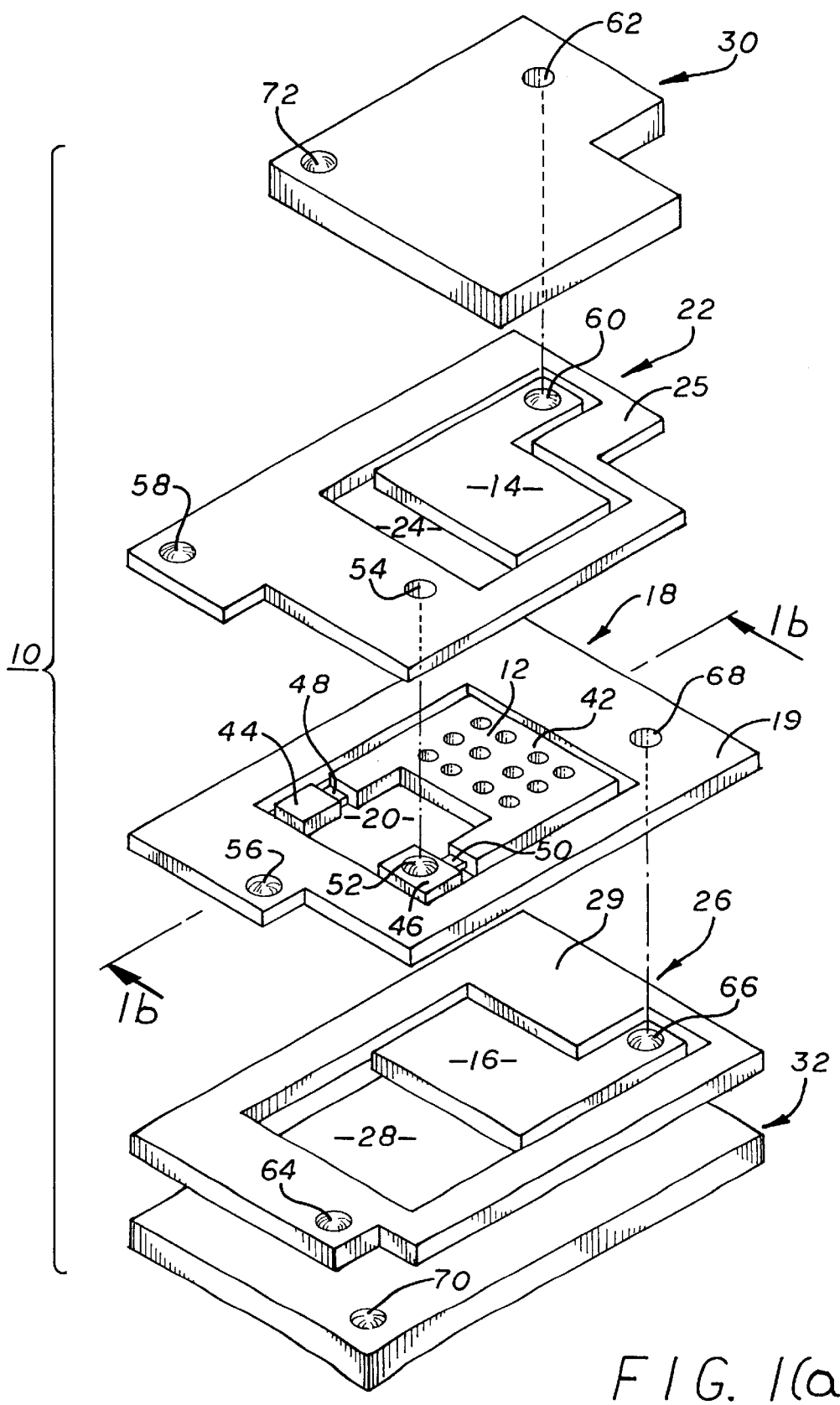
FIGS. 1(a) and 1(b) are an exploded perspective (with oxide layers removed) and a cross-sectional view in elevation, respectively, of a micromechanical accelerometer in accordance with the invention.

FIG. 1(a) is an exploded perspective view of a micromechanical accelerometer 10 in accordance with the invention. Oxide layers are removed from FIG. 1(a) to facilitate comprehension of the structure of the accelerometer 10 that provides the advantages of reduced stray capacitance, improved shielding, and topside wire bonding access in contrast to devices of the prior art.

The accelerometer 10 comprises a plurality of generally-planar silicon wafers which, in combination, interact to support and hermetically seal a pendulous mass 12 between a pair of electrodes 14 and 16. The electrodes 14 and 16 may act as both pick-offs and forcers in a charge-controlled force rebalanced system such as that disclosed in U.S. Pat. No. 5,142,921 of Robert E. Stewart, et al. entitled "Force Balance Instrument With Electrostatic Charge Control".

Each of the above-identified elements is formed by known micromachining techniques (e.g. ICP/RIE etching) to form distinct and separate elements within a parent wafer. That is, the pendulous mass 12 is formed within a pendulum wafer 18 and is separate from a surrounding pendulum frame 19 having an internal aperture 20. Similarly, the electrode 14 comprises a portion of a top electrode wafer 22 and is positioned within an internal aperture 24 of a surrounding guard ring 25 while the electrode 16 comprises a portion of a bottom electrode wafer 26 located within an internal aperture 28 of a surrounding guard ring 29. A top cover wafer 30 and a bottom cover wafer 32 complete the semiconductor elements of the accelerometer 10.

Figure 1B:
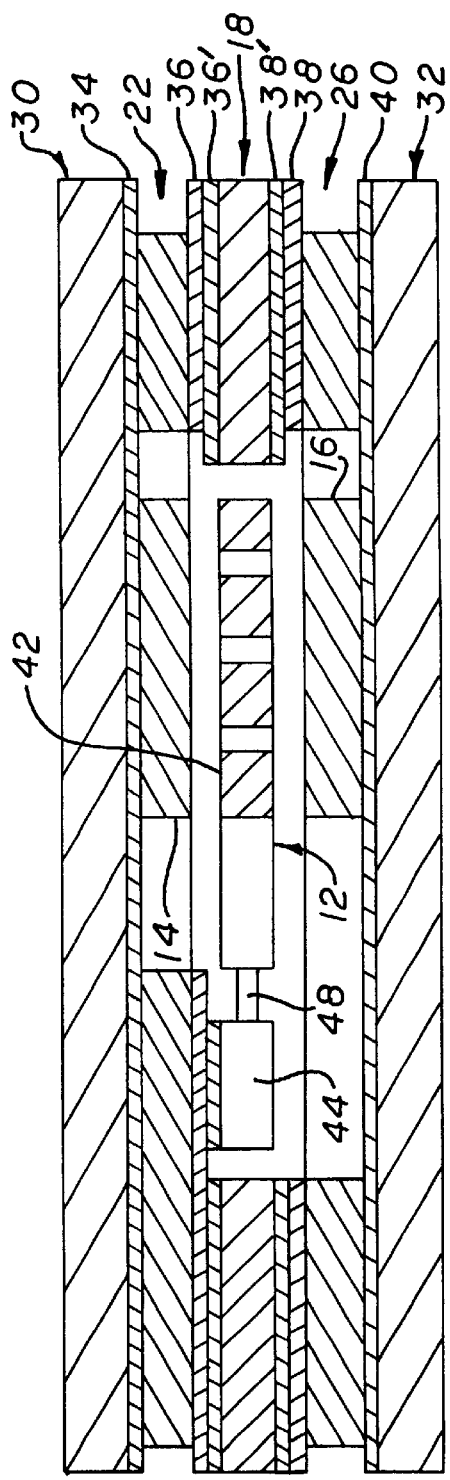

Referring to FIG. 1(b), a side elevation view in cross-section of the accelerometer 10 taken at line 1(b)—1(b) of FIG. 1(a), insulative oxide layers 34, 36, 36', 38', 38 and 40 provide spacing between the semiconductor wafers 30, 22, 18, 26, and 32 respectively. The spacings between the planar surfaces of the pendulous mass 12 and the facing surfaces of the electrodes 14 and 16 are determined by the thicknesses of the pairs of oxide layers 36, 36', 38', and 38 respectively. The various oxide layers and wafers are shaped by known dry etching processes, such as those of the RIE type. Such processes include, for example, the deep trench dry silicon etching processes commercially known as "BOSCH" and "ALCATEL". As can be seen, the peripheral edges of the top and bottom electrode wafers 22 and 26 are recessed with respect to those of the adjacent oxide layers to lengthen the distances between the peripheral edges of the wafers and thereby lessen the possibility of shorting occasioned by the presence of some contamination within the oxide layers or the like. It will be seen that like arrangements are provided with respect to a micromechanical angular rotation rate sensor, discussed below.

The oxide layers 34 and 40 may be grown upon the upper and lower cover wafers 30 and 32, then fusion-bonded to the upper and lower electrode wafers 22 and 26 respectively during assembly. Alternately, the accelerometer 10 may be formed from a total of three (3) initial wafers, provided those of the SOI type are utilized. In such an arrangement, the upper cover wafer 30, the oxide layer 34 and the upper electrode wafer 22 would comprise one SOI wafer while the combination of the lower electrode wafer 26, the oxide layer 40, and the lower cover wafer 32 would comprise another SOI wafer.

Referring to FIG. 1(a) and 1(b) in combination, one may observe that the pendulous mass 12 comprises a paddle-like element 42 with parallel arms adjacent its opposed sides that are joined to pedestals 44 and 46 at flexure regions 48 and 50 of reduced thickness. As can be seen in FIG. 1(b), the pendulous mass 12 is etched to form an element that is separate from the surrounding pendulum frame 18 and secured to the overlying composite oxide layers 36, 36' at the pedestals 44 and 46 through fusion-bonding or like process.

By limiting the area of contact with the overlying composite oxide layers 36, 36' to the upper surfaces of the pedestals 44 and 46, the amount of stray capacitance is minimized. Furthermore, by providing a device in which the pendulum frame 19 and the pendulous mass 12 are distinct and unconnected members, one may maintain the pendulous mass 12 at a different operational potential than that of the surrounding frame 19. Electrical contact to the pendulous mass 12 is made at an ohmic contact 52 that is accessed through a via 54 etched in an exposed guard ring region of the top electrode wafer 22 whereas contact to the pendulum frame 19 is made at an ohmic contact 56 formed at an exposed region of the upper surface of the frame 19. It is thus possible to ground the pendulum frame without interfering with the operation of the pendulous mass 12, which must be kept at a non-ground potential to create the required electric field force between the element 42 and the electrodes 14 and 16. Likewise, as the top electrode 14 is etched to form an element separate from the surrounding guard ring 25 and the bottom electrode 16 is etched to form an element separate from the surrounding guard ring 29, it is also possible to electrically shield the accelerometer 10 electrically from the environment by contacting the guard ring 25 (at an ohmic contact 58) and the top electrode 14 (at an ohmic contact 60) separately to permit grounding of the guard ring 25 without interfering with the operation of the device. The independent contacting of the guard ring 25 and the top electrode 14 is obtained since the ohmic contact 58 is located within an exposed region of the top electrode wafer guard ring 25 while the ohmic contact 60 is accessible through a via 62 etched within the top cover wafer 30. Likewise, the guard ring 29 of the bottom electrode wafer 26 may be grounded by means of an ohmic contact 64 located within an exposed region of the top surface of the guard ring 29 while an ohmic contact 66 to the bottom electrode 16 underlies a via 68 formed within an exposed region of the frame 19 of the overlying pendulum wafer 18.

An ohmic contact 70 located in an exposed corner region of the bottom electrode wafer 32 and a contact 72 formed at the top surface of the top cover wafer 30 complete the configuration of the accelerometer 10 for receiving wire conductors required to transmit and receive the necessary signal outputs and inputs for device operation. As can be seen, all points of contact may be accessed from the topside of the accelerometer 10 for bonding purposes. Thus, the entire structure of the accelerometer 10 is amenable to topside wire bonding to greatly facilitate its integration with system electronics. Such topside bonding may be accomplished without compromising hermetic sealing of the chamber within which the pendulous mass is spaced from the top and bottom electrodes 14 and 16.

The contacts 70 and 72 permit grounding of the bottom and top cover wafers 32 and 30 respectively. Thus, all exterior portions of the accelerometer 10 can be grounded without affecting device operation. In addition to offering both topside wire bonding and improved shielding over prior art devices, the structure of the pendulous mass 12, which minimizes the area of the contact region between the mass 12 and the overlying oxide layer minimizes stray capacitance. All of the above advantages are obtained as a result of the etching of the various wafers to (1) obtain independence between shielding and shielded structures, (2) minimize the contact area for supporting the pendulous mass 12, and (3) selective etching of the edges of the various wafers to permit topside access to underlying ohmic contacts.

Figure 2B:
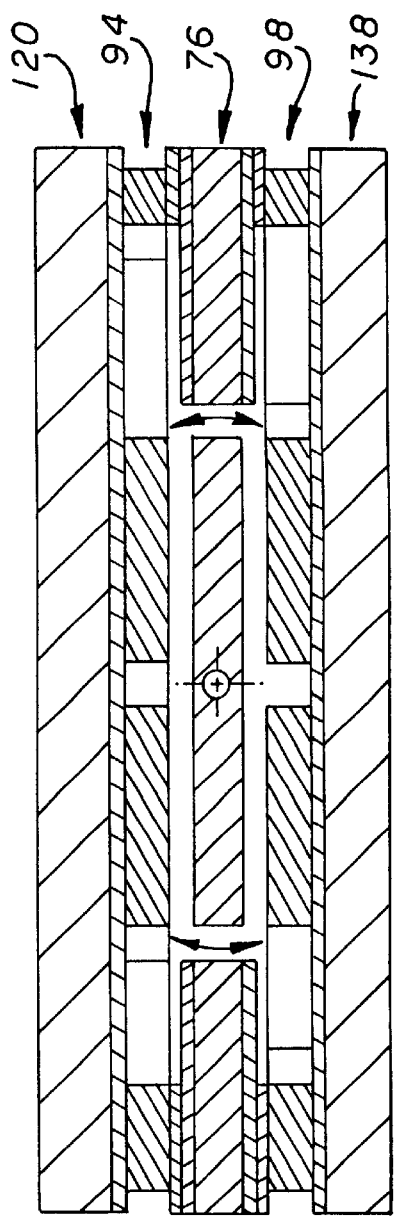
FIGS. 2(a) and 2(b) are an exploded perspective view (with oxide layers removed) and a cross-sectional view in elevation, respectively, of a micromechanical angular rotation rate sensor in accordance with the invention.
Figure 2A:
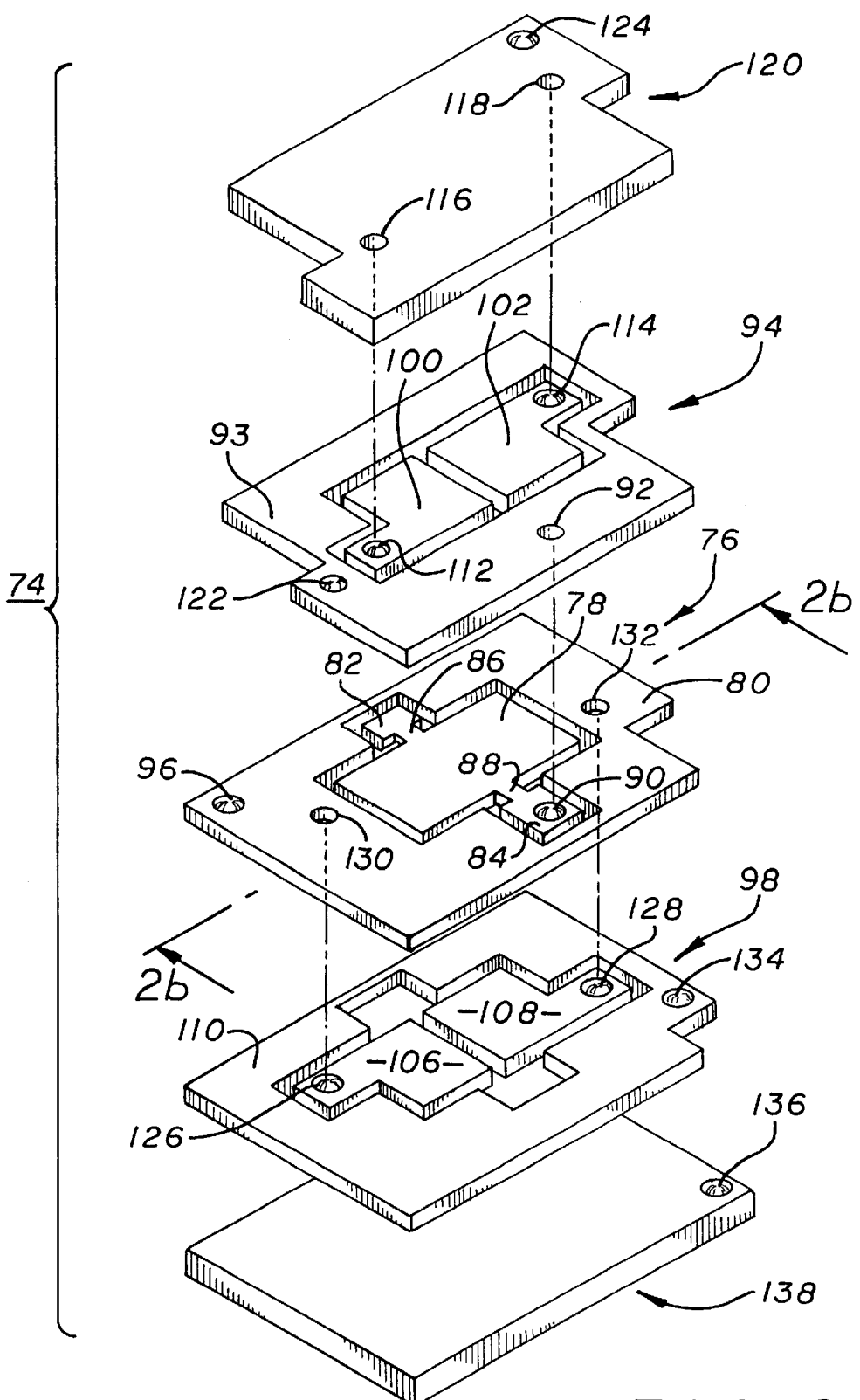

FIG. 2(a) is an exploded perspective view for illustrating the alignment of the semiconductor wafers that form a sensor element for an angular rotation rate sensor in accordance with the invention. Basically, the sensor element 74 adapts like structures to those employed in the accelerometer 10 to obtain the advantages of reduced stray capacitance, topside wire bonding and complete electrical shielding. That is, a sensing element wafer 76 is etched to form therein a sensing member 78 that is independent of a surrounding frame 80. The sensing member 78 includes opposed pedestals 82 and 84 that terminate aligned support arms 86 and 88. It is known that, in operation (i.e., sensor element 74 oscillated about a vertical axis), the sensing member 78 will experience a Coriolis acceleration force, causing oscillatory deflection at the dither frequency about an axis coincident with the support arms 86 and 88.

Again, as in the case of the accelerometer 10, an ohmic contact 90, accessible through a via 92 formed within an exposed guard ring 93 region of a top electrode layer 94 and an ohmic contact 96 formed within an exposed region of the frame 80 of the sensing element wafer 76, permits operation of the sensing element 78 at the same time the surrounding frame 80 is grounded for shielding purposes.

Likewise, the etching of the top electrode wafer 94 and a bottom electrode wafer 98 to form separate electrodes 100 and 102 within a surrounding guard ring 110 (the top electrode wafer 94) and, correspondingly, separate electrodes 106 and 108 within a surrounding guard ring 93 (the bottom electrode wafer 98) permits the shielding of these wafers from the environment. The provision of ohmic contacts 112 and 114 upon the electrodes 100 and 102 accessed through vias 116 and 118 within a top cover wafer 120 allows the electrodes to be maintained at an operational potential while an ohmic contact 122 located in an exteriorly-accessible upper surface of the guard ring 93 of the wafer 94 and an ohmic contact 124 at the top surface of the top cover wafer 120 permit independent grounding of these members.

Similarly, topside wire bonding to the electrodes 106 and 108 of the bottom electrode wafer 98 is made possible by ohmic contacts 126 and 128 at the top surfaces of electrodes 106 and 108 respectively. The contacts 126 and 128 are accessed through vias 130 and 132 within exposed regions of the frame 80 of the sensing element wafer 76. The independent grounding of the surrounding guard ring 110 of the wafer 98 is accomplished by means of an ohmic contact 134 within an exposed region of the upper surface of the guard ring 110 of the wafer 98. Finally, the complete grounding of the exterior of the sensing element 74 is obtained by means of an ohmic contact 136 located within an exposed region of the upper surface of a bottom cover wafer 138.

The manufacture of devices in accordance with the invention may employ conventional micromachining processes. For example, referring to the accelerometer 10, prior to assembly the various oxide layers may be grown upon the appropriate semiconductor wafer layers (i.e. the oxide layer 34 grown on the lower surface of the top cover layer 30, the oxide layer 40 grown on the top surface of the bottom cover layer 32, the oxide layer 36 grown upon the bottom of the top electrode layer 22 and the oxide layer 38 grown upon the top surface of the bottom electrode layer 26. Oxide layers unavoidably grown upon the other surfaces of the layers are etched away.) The oxide layers 36' and 38' are grown upon the top and bottom surfaces, respectively, of the pendulum frame wafer 18. The thicknesses of the composite oxide layers 36, 36' and 38', 38 are chosen to provide predetermined spacing between the facing surfaces of the paddle-like element 42 and the electrodes 14, 16.

Once appropriate oxide layers have been created (or, in the alternative, SOI wafers appropriately employed), the top electrode wafer 22 and the bottom electrode wafer 26 are dry-etched to define the internal structures illustrated and described above while the pendulum wafer 18 is only partially-etched to avoid subsequent problems pertaining to alignment of the pendulous mass 12 with respect to the surrounding frame 19. The partially- etched pendulum wafer 18 and the top SOI electrode wafer 22 are then aligned and fusion-bonded to one another so that the proofmass 12 is fixed to the wafer 22 at the pedestals 44 and 46. The etching of the pendulum wafer 18 is completed and subsequently bonded to the bottom electrode wafer 22 (and the oxide layer 34 and the cover wafer 30 in the case of SOI). Thereafter, metallizations for forming the various ohmic contacts are applied and the requisite vias and exterior edges of the wafers appropriately etched. Assembly processes are performed within a vacuum environment to prevent capture of atmospheric gases within the open regions provided for movement of the paddle 14 of the accelerometer 10 and the sensor member 78 of the sensing element 74. The evacuation of these regions prevents undesirable gas damping. Also, as each of the devices is capable of maintaining a hermetic seal about a sensitive member, it is unnecessary to maintain a vacuum within the case to which the device is (either directly or indirectly) mounted.

Thus, it is seen that the present invention provides micromachined structures for inertial sensors that offer reduced stray capacitance, improved shielding and total topside wire bonding. By utilizing the structures taught by the invention, one may realize devices of increased accuracy and enhanced manufacturability. As a result, batch processing is facilitated and production costs are reduced.

While this invention has been described with reference to its presently-preferred embodiment, it is not limited thereto. Rather, this invention is limited only insofar as it is defined by the following set of patent claims and includes within in its scope all equivalents thereof.

What is claimed is:

1. A micromechanical silicon accelerometer comprising, in combination:
    (a) top cover, top electrode, pendulum, bottom electrode, and bottom cover wafers, each of said wafers being generally-planar;
    (b) said wafers being arranged so that said top cover wafer is adjacent said top electrode wafer, said top electrode wafer is adjacent said pendulum wafer, said pendulum wafer is adjacent said bottom electrode wafer, and said bottom electrode wafer is adjacent said bottom cover wafer;
    (c) a first generally-planar oxide layer located between said top cover and said top electrode wafers, a second generally-planar oxide layer located between said top electrode and said pendulum wafers, a third generally-planar oxide layer located between said pendulum and said bottom electrode wafers and a fourth generally-planar oxide layer located between said bottom electrode and said bottom cover wafers;
    (d) said pendulum wafer defining a substantially-planar pendulum member and a surrounding frame member having an internal aperture; and
    (e) said pendulum member being located within said internal aperture and separate from said frame member.

2. A micro-mechanical silicon accelerometer as defined in claim 1 further characterized in that each of said second and third oxide layers comprises a composite of two substantially-planar oxide layers bonded to one another at facing surfaces.

3. A micro-mechanical silicon accelerometer as defined in claim 1 wherein each of said second and third oxide layers has an internal aperture to accommodate said pendulum member.

4. A micromechanical silicon accelerometer as defined in claim 3 further including:
    (a) said pendulum member comprises a paddle and a pair of opposed legs extending therefrom;
    (b) each of said legs terminates in a pedestal; and
    (c) each of said pedestals is fixed to the bottom surface of said second generally-planar oxide layer.

5. A micromechanical silicon accelerometer as defined in claim 3 wherein each of said top and bottom electrode wafers further includes:
    (a) a substantially-planar electrode and a surrounding guard ring having an internal aperture; and
    (b) said electrode being located within said internal aperture of said guard ring and separate from said guard ring.

6. A micromechanical silicon accelerometer as defined in claim 1 further characterized in that at least one edge of each wafer is at least partially recessed with respect to the edges of all underlying wafers.

7. A micromechanical silicon accelerometer as defined in claim 6 wherein peripheral edges of said top and bottom electrode wafers are recessed with respect to the peripheral edges of adjacent oxide layers.

8. A micromechanical silicon sensor element for an angular rate of rotation sensor comprising, in combination:
    (a) top cover, top electrode, sensing element, bottom electrode, and bottom cover wafers, each of said wafers being generally-planar;
    (b) said wafers being arranged so that said top cover wafer is adjacent said top electrode wafer, said top electrode wafer is adjacent to said sensing element wafer, said sensing element wafer is adjacent said bottom electrode wafer, and said bottom electrode wafer is adjacent said bottom cover wafer;
    (c) a first generally-planar oxide layer located between said top cover and said top electrode wafers, a second generally-planar oxide layer located between said top electrode and said sensing element wafers, a third generally-planar oxide layer located between said sensing element and said bottom electrode wafers and a fourth generally-planar oxide layer located between said bottom electrode and said bottom cover wafers;
    (d) said sensing element wafer defining a substantially-planar sensing member and a surrounding frame having an internal aperture; and
    (e) said sensing member being located within said internal aperture and separate from said frame.

9. A micromechanical silicon sensor element as defined in claim 8 further characterized in that each of said second and third oxide layers comprises a composite of two substantially-planar oxide layers bonded to one another at facing surfaces.

10. A micromechanical silicon sensor element as defined in claim 8 wherein each of said second and third oxide layers has an internal aperture to accommodate said sensing member.

11. A micromechanical silicon sensor element as defined in claim 10 further including:
    (a) said sensing member comprises a paddle in an aligned pair of transverse members defining an axis of rotation;
    (b) each of said transverse members terminates in a pedestal; and
    (c) each of said pedestals is fixed to the bottom surface of said second generally-planar oxide layer.

12. A micromechanical silicon sensor element as defined in claim 10 wherein top and bottom electrode layers each further includes:
    (a) two substantially-planar electrodes and a surrounding guard ring having an internal aperture; and
    (b) said electrodes being located within said internal aperture and separate from said guard ring.

13. A micromechanical sensor element as defined in claim 10 further characterized in that at least one edge of each wafer is a least partially recessed with respect to the edges of all underlying wafers.

14. A micromechanical sensor element as defined in claim 13 wherein peripheral edges of said top and bottom electrode wafers are recessed with respect to the peripheral edges of adjacent oxide layers.

15. A micromechanical silicon accelerometer comprising, in combination:

(a) top cover, top electrode, pendulum, bottom electrode, and bottom cover wafers, each of said wafers being generally-planar;

(b) said wafers being arranged so that said top cover wafer is adjacent said top electrode wafer, said top electrode wafer is adjacent said pendulum wafer, said pendulum wafer is adjacent said bottom electrode wafer, and said bottom electrode wafer is adjacent said bottom cover wafer;

(c) a first generally-planar oxide layer located between said top cover and said top electrode wafers, a second generally-planar oxide layer located between said top electrode and said pendulum wafers, a third generally-planar oxide layer located between said pendulum and said bottom electrode wafers and a fourth generally-planar oxide layer located between said bottom electrode and said bottom cover wafers;

(d) said pendulum wafer defining a substantially-planar pendulum member and a surrounding frame member having an internal aperture;

(e) said pendulum member being located within said internal aperture and separate from said frame member;

(f) each of said second and third oxide layers has an internal aperture to accommodate said pendulum member;

(g) each of said top and bottom electrode wafers further includes (i) a substantially-planar electrode and a surrounding guard ring having an internal aperture; and (ii) said electrode being located within said internal aperture of said guard ring and separate from said guard ring;

(h) one side of said top cover wafer being recessed with respect to an underlying top electrode wafer so that the top surface of a section of said guard ring is exposed;

(i) an ohmic contact being located within said top surface of said section of said guard ring;

(j) an ohmic contact being located within a top surface of said electrode of said top electrode wafer;

(k) an aperture passing through said top cover wafer overlying and aligned with said ohmic contact located within said top surface of said electrode of said top electrode wafer;

(l) one side of said exposed section of said guard ring being recessed to expose the top surface of an underlying portion of said frame member;

(m) an ohmic contact being located within the top surface of said exposed portion of said frame member;

(n) an ohmic contact being located within the top surface of said pendulum member;

(o) an aperture passing through said top electrode wafer overlying and aligned with said ohmic contact located within the top surface of said electrode of said bottom electrode wafer;

(p) one side of said exposed portion of said frame member being recessed to expose the top surface of an underlying portion of the guard ring of said bottom electrode wafer;

(q) an ohmic contact being located within the top surface of said exposed portion of said guard ring of bottom electrode wafer;

(r) an ohmic contact being located within the top surface of said electrode of said bottom electrode wafer;

(s) the opposed sides of said top cover and top electrode wafers being recessed to expose the top surface of a second underlying portion of said frame member of said pendulum wafer;

(t) an aperture passing through said exposed second underlying portion of said frame member of said pendulum wafer, said aperture overlying and being aligned with said ohmic contact located within the top surface of said electrode of said bottom electrode wafer;

(u) one side of said bottom electrode wafer being recessed to expose the top surface of a portion of said bottom cover wafer; and (v) an ohmic contact being located within said top surface of said exposed portion of said bottom cover wafer.

16. A micromechanical silicon sensor element for an angular rate of rotation sensor comprising, in combination:

(a) top cover, top electrode, sensing element, bottom electrode, and bottom cover wafers, each of said wafers being generally-planar;

(b) said wafers being arranged so that said top cover wafer is adjacent said top electrode wafer, said top electrode wafer is adjacent to said sensing element wafer, said sensing element wafer is adjacent said bottom electrode wafer, and said bottom electrode wafer is adjacent said bottom cover wafer;

(c) a first generally-planar oxide layer located between said top cover and said top electrode wafers, a second generally-planar oxide layer located between said top electrode and said sensing element wafers, a third generally-planar oxide layer located between said sensing element and said bottom electrode wafers and a fourth generally-planar oxide layer located between said bottom electrode and said bottom cover wafers;

(d) said sensing element wafer defining a substantially-planar sensing member and a surrounding frame having an internal aperture;

(e) said sensing member being located within said internal aperture and separate from said frame;

(f) each of said second and third oxide layers has an internal aperture to accommodate said sensing member;

(g) said top and bottom electrode wafers each further includes (i) two substantially-planar electrodes and a surrounding guard ring having an internal aperture; and (ii) said electrodes being located within said internal aperture and separate from said guard ring;

(h) one side of said top cover wafer being recessed with respect to an underlying top electrode wafer so that the top surfaces of a first section of said guard ring and a first section of said frame are exposed;

(i) an ohmic contact being located within said top surfaces of said section of said guard ring;

(j) ohmic contacts being located within a top surface of each of said electrodes of said top electrode wafer;

(k) apertures passing through said top cover wafer overlying and aligned with said ohmic contacts located within a top surface of each of said electrodes of said top electrode wafer;

(l) a second side of said top cover wafer being recessed to expose a second section of said guard ring;

(m) an ohmic contact being located within the top surface of a pedestal of said sensing member;

(n) an aperture passing through said second section of said guard ring overlying and aligned with said ohmic contact located within the top surface of a pedestal of said sensing member;

(o) an ohmic contact being located within said first section of said frame;

(p) an ohmic contact located within the top surface of each electrode of said bottom electrode wafer;

(q) a third side of said top cover wafer, a second side of said top electrode wafer and a side of said sensing element wafer being recessed so that sections of said bottom electrode wafer are successively exposed;

(r) an ohmic contact being located within the top surfaces of each of said electrodes of said bottom electrode wafer and said exposed section of said bottom electrode wafer;

(s) apertures passing through said exposed sections of said sensing element wafer overlying and aligned with said ohmic contact located within the top surfaces of said electrodes of said bottom electrode wafer;

(t) one side of said bottom electrode wafer being recessed to expose the top surface of a portion of said bottom cover wafer; and (u) an ohmic contact being located within said top surface of said exposed portion of said bottom cover wafer.

* * * * *